United States Patent
Ugaji et al.

(10) Patent No.: US 7,217,478 B2
(45) Date of Patent: May 15, 2007

(54) SOLID ELECTROLYTE AND ALL-SOLID BATTERY USING THE SAME

(75) Inventors: Masaya Ugaji, Suita (JP); Shinji Mino, Ibaraki (JP); Yasuyuki Shibano, Sakai (JP); Shuji Ito, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 611 days.

(21) Appl. No.: 10/720,219

(22) Filed: Nov. 25, 2003

(65) Prior Publication Data

US 2004/0106045 A1 Jun. 3, 2004

(30) Foreign Application Priority Data

Nov. 27, 2002 (JP) .............................. 2002-344470

(51) Int. Cl.
*H01M 10/36* (2006.01)
(52) U.S. Cl. ..................................... 429/322
(58) Field of Classification Search .................... None
See application file for complete search history.

(56) References Cited

U.S. PATENT DOCUMENTS

| 5,597,660 A | 1/1997 | Bates et al. |
| 2002/0034688 A1 | 3/2002 | Chu et al. |
| 2004/0048157 A1* | 3/2004 | Neudecker et al. ...... 429/231.2 |
| 2004/0072066 A1* | 4/2004 | Cho et al. .................... 429/137 |

FOREIGN PATENT DOCUMENTS

JP 2002-203593 * 7/2002

* cited by examiner

*Primary Examiner*—Jonathan Crepeau
(74) *Attorney, Agent, or Firm*—Stevens, Davis, Miller & Mosher, LLP

(57) ABSTRACT

To inhibit decrease in charge-discharge, storage and charge-discharge cycle characteristics due to reduction of phosphorus atoms in a battery including lithium phosphorus oxynitride as a solid electrolyte, a transition metal element is incorporated into lithium phosphorus oxynitride to prepare a solid electrolyte.

1 Claim, 2 Drawing Sheets

SOLID ELECTROLYTE AND ALL-SOLID BATTERY USING THE SAME

BACKGROUND OF THE INVENTION

The present invention relates to a solid electrolyte for an all-solid battery. In particular, it relates to a solid electrolyte for an all-solid thin-film lithium rechargeable battery.

According to development of portable devices such as personal computers and cellular phones in recent years, demands for a battery as a power source is increasingly growing. Especially, due to small atomic weight and high ionization potential of lithium, a lithium rechargeable battery has been actively studied in various fields as a promising battery capable of showing high energy density.

Since batteries for such applications adopt a liquid electrolyte, it is difficult to completely resolve problems such as leakage of the electrolyte. Further, due to its high energy density, the lithium rechargeable battery may possibly cause generation of heat if trouble is caused in the battery. For these reasons, the electrolyte is required to be nonflammable.

A solution to these problems is an all-solid battery using a solid electrolyte in place of the liquid electrolyte. The battery is made of solid components only, permitting improvement in battery reliability, as well as reduction in size and thickness of the battery. Thus, development of an all-solid lithium rechargeable battery using a solid electrolyte made of a nonflammable solid material has been longed for.

Known examples of the solid electrolyte for the all-solid lithium rechargeable battery include, for example, lithium halide, lithium nitride, oxyacid salt of lithium and their derivatives. In particular, U.S. Pat. No. 5,597,660 has reported that lithium phosphorus oxynitride ($Li_xPO_yN_z$: x=2.8, 3z+2y=7.8) obtained by introducing nitrogen (N) into lithium orthophosphate ($Li_3PO_4$) shows as considerably high Li ion conductivity as 1 to $2\times10^{-6}$ S/cm in spite that it is an oxide-based material. Therefore, it has been adopted in an all-solid lithium rechargeable battery, especially in an all-solid thin-film lithium rechargeable battery, used as a power source for microelectronic devices such as IC cards and electronic tags.

However, if the lithium phosphorus oxynitride ($Li_xPO_yN_x$) adopted as the solid electrolyte in the above-described patent publication is left in humid atmosphere, it reacts with moisture to deteriorate, considerably decreasing its ion conductivity. A cause of the deterioration is that a phosphorus atom (P) is reduced from +5 to decompose the lithium phosphorus oxynitride.

If such deterioration occurs, an all-solid lithium rechargeable battery decreases in electrochemical characteristics such as charge-discharge, storage and charge-discharge cycle characteristics. Accordingly, an object of the present invention is to provide a solid electrolyte suppressing the reduction of phosphorus atoms in lithium phosphorus oxynitride as much as possible to resist the deterioration.

BRIEF SUMMARY OF THE INVENTION

To solve the above problems, the present invention provides a solid electrolyte comprising lithium phosphorus oxynitride and a transition metal element (atom).

The transition metal element is preferably at least one selected from the group consisting of Ti, V, Cr, Mn, Fe, Co, Ni, Cu, Zr, Nb, Mo, Ru, Ag, Ta, W, Pt and Au.

The content of the transition metal element is preferably 1 to 50 atom % to phosphorus atoms.

Further, the present invention also relates to an all-solid battery using the above-described solid electrolyte.

According to the present invention as described above, a solid electrolyte including; lithium phosphorus oxynitride containing a transition metal element is used. As a result, the deterioration of electrochemical characteristics caused in humid atmosphere is suppressed.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
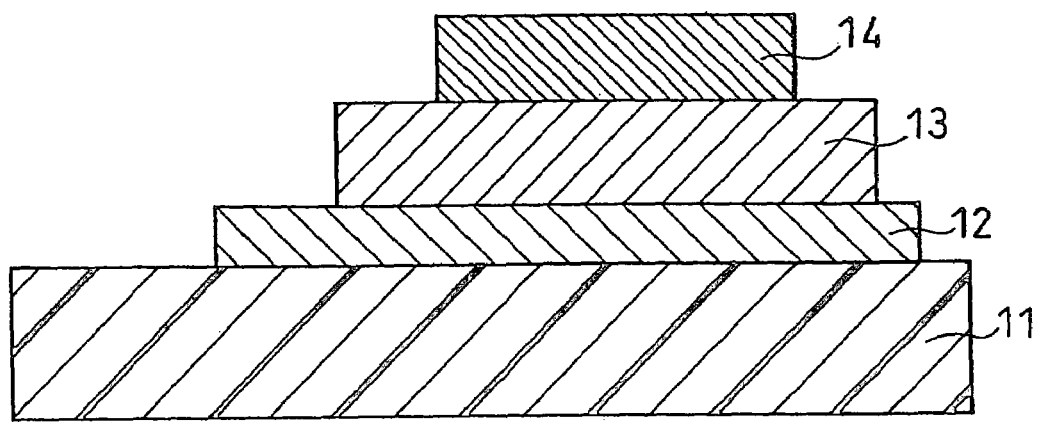
FIG. 1 is a schematic sectional view of an experimental cell fabricated in Examples of the present invention.

The solid electrolyte according to the present invention is obtained by introducing a transition metal element T into lithium phosphorus oxynitride ($Li_xPO_yN_x$). Accordingly, the solid electrolyte of the present invention is represented by the formula (1):

$$Li_aPO_bN_c\text{-}T_d \qquad (1)$$

where a=2.6 to 3.0, b=3.0 to 4.0, c=0.1 to 0.6 and d=0.01 to 0.50.

As to the solid electrolyte represented by the formula (1), a lithium atom (Li), a phosphorus atom (P), an oxygen atom (O) and a nitrogen atom (N) have valences of +1, +5, −2 and −3, respectively. The valence of the transition metal element T is regarded as 0 because it is incorporated into the lithium phosphorus oxynitride in a metallic state.

The lithium phosphorus oxynitride ($Li_xPO_yN_x$) as the solid electrolyte of the present invention may contain the transition metal element in a compound state such as a transition metal oxide or nitride.

If the transition metal element exists as a transition metal oxide, the solid electrolyte of the present invention is represented by the formula (2):

$$Li_aPO_bN_c\text{-}T_dO_e \qquad (2)$$

where a=2.6 to 3.0, b=3.0 to 4.0, c=0.1 to 0.6, d=0.01 to 0.50 and e=0.005 to 0.175.

Further, if the transition metal element exists as a transition metal nitride, the solid electrolyte of the present invention is represented by the formula (3):

$$Li_aPO_bN_c\text{-}T_dN_e \qquad (3)$$

where a=2.6 to 3.0, b=3.0 to 4.0, c=0.1 to 0.6, d=0.01 to 0.50 and e=0.003 to 0.12.

If a solid electrolyte made exclusively of lithium phosphorus oxynitride is left in humid atmosphere, it easily reacts with moisture to deteriorate, decreasing its ion conductivity. A cause of the deterioration is that part of phosphorus atoms (P) contained in the lithium phosphorus oxynitride is reduced from +5 during the manufacture of a thin lithium phosphorus oxynitride film.

However, in the solid electrolyte of the present invention, the transition metal element contained therein is reduced preferentially over the phosphorus atoms (P) because of its higher reducibility than the phosphorus atoms and valence that varies easily. Thereby, the valence of +5 of the phosphorus atoms in the lithium phosphorus oxynitride is retained.

The solid electrolyte of the present invention comprising the lithium phosphorus oxynitride containing the transition metal element may be prepared in the same manner as conventional lithium phosphorus oxynitride, i.e., by a common technique for preparing a thin film using a vacuum system. It is also possible to adopt other techniques than the one using the vacuum system.

A typical thin-film preparation technique using the vacuum system is a combination of vapor deposition and ion beam irradiation for introducing nitrogen ions. Examples of the vapor deposition include: sputtering in which a target is sputtered by nitrogen ($N_2$) using a magnetron or high frequency; resistance heating vapor deposition in which a deposition source is heated by resistance heating to be vapor-deposited; electron beam deposition in which a deposition source is heated by electron beam to be vapor-deposited; and laser abrasion in which a deposition source is heated by laser heating to be vapor-deposited.

In order to prepare the solid electrolyte of the present invention, it is necessary to use a lithium orthophosphate ($Li_3PO_4$) target or deposition source and another target or deposition source for introducing the transition metal element.

For example, when the sputtering is adopted, lithium orthophosphate and a transition metal element are used as the targets. If the resistance heating vapor deposition, electron beam deposition or the laser abrasion is adopted, lithium orthophosphate and a transition metal element are used as the deposition sources. It is also possible to mix the transition metal element in the lithium orthophosphate target or deposition source in a desired mixing ratio.

The vapor deposition may be performed by a combination of resistance heating vapor deposition using lithium phosphate as the deposition source and electron beam deposition using a transition metal as the deposition source.

The transition metal element T may be used directly as the deposition source. However, it is also possible to perform the vapor deposition using a transition metal oxide or nitride as the deposition source such that the transition metal element is introduced in the resulting thin film as an oxide or nitride. In particular, it is convenient to use the transition metal oxide because the transition metal element has been oxidized and will be reduced easily.

Typical examples of the transition metal element T include titanium (Ti), vanadium (V), chromium (Cr), manganese (Mn), iron (Fe), cobalt (Co), nickel (Ni), copper (Cu), zirconium (Zr), niobium (Nb), molybdenum (Mo), ruthenium (Ru), silver (Ag), tantalum (Ta), tungsten (W), platinum (Pt) and gold (Au). Other transition metal elements than the above may also be used as long as the effect of the present invention is not impaired. Further, not only a single kind, but also two or more kinds of the transition metal element may be contained.

The content of the transition metal element T in the solid electrolyte of the present invention is preferably 1 to 50 atom % to the phosphorus atoms (P) in lithium phosphorus oxynitride of the solid electrolyte.

If the content of the transition metal element is smaller than 1 atom %, the reduction of the phosphorus atoms cannot be fully suppressed. On the other hand, if the content is larger than 50 atom %, the framework structure of the lithium phosphorus oxynitride is destroyed, thereby the solid electrolyte may possibly decrease in ion conductivity and increase in electron conductivity. If the solid electrolyte showing the increased electron conductivity is used as a solid electrolyte layer of a thin-film rechargeable battery, the solid electrolyte layer is apt to cause self-discharge in a charged state.

The solid electrolyte of the present invention is preferably in the thin film form. Its thickness may suitably be controlled, but preferably 0.1 to 10 μm.

Figure 2:
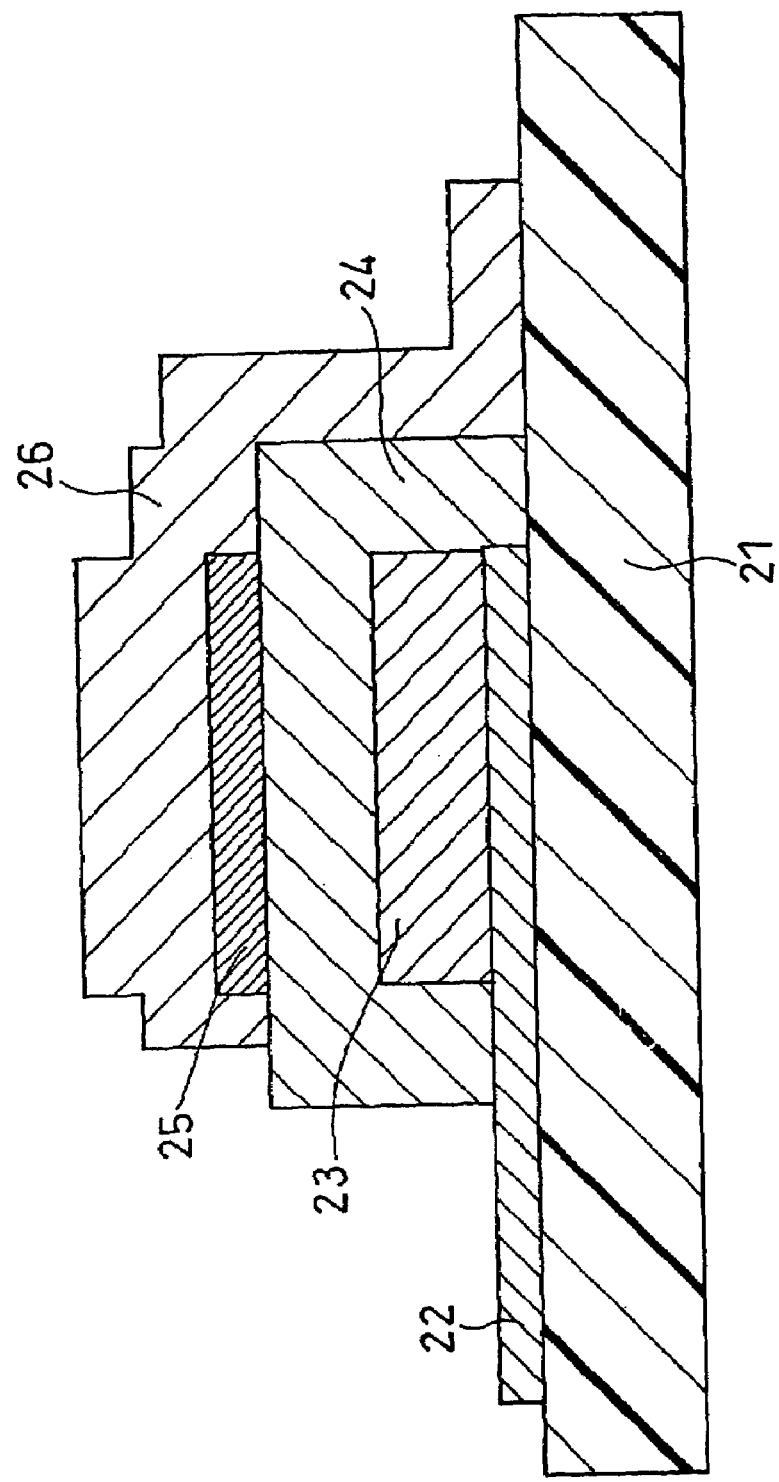
FIG. 2 is a schematic sectional view of a test battery fabricated in the present invention.

FIG. 2 shows a structure of a typical all-solid thin-film lithium rechargeable battery as an example of the all-solid battery including the solid electrolyte of the present invention. The battery includes a first current collector 22, a first electrode 23, a solid electrolyte 24, a second electrode 25 and a second current collector 26 formed on a base plate 21. In this context, the first electrode is a positive electrode layer and the second electrode is a negative electrode layer. However, this relationship may be reversed.

The battery is formed by stacking the first current collector 22, the first electrode 23, the solid electrolyte 24, the second electrode 25 and the second current collector 26 on the base plate 21 in this order by a thin-film preparation technique using a vacuum system. As a matter of course, they may be formed by other techniques than the thin-film preparation technique using the vacuum system. It is further advantageous to form a resin film or an aluminum laminate film as a protective layer on the second current collector 26. In usual, the thickness of the protective layer is usually not less than 10 μm. If the first electrode 23, the solid electrolyte 24 and the second electrode 25, which are prevented from deteriorating due to water, the protective layer can be as thinner as from several μm to a negligible thickness.

The base plate 21 may be made of an electrically insulating material such as alumina, glass or a polyimide film, a semiconductor material such as silicon, or a conductive material such as aluminum or copper. It is further advantageous that the base plate surface is mirror-finished because smaller surface roughness is preferred. When a semiconductor base plate such as silicon is used, other electrical device such as display device or memory device can be formed or mounted on the same semiconductor base plate.

The first current collector 22 formed first on the base plate 21 is made of a material having electron conductivity, e.g., platinum, platinum/palladium, gold, silver, aluminum, copper and ITO (indium-tin oxide film). Other materials than the above may be used as long as they have electron conductivity and do not react with the first electrode. The first current collector may be formed by sputtering, resistance heating vapor deposition, ion beam deposition or electron beam deposition. If the base plate 21 is made of a conductive material such as aluminum, copper or stainless steel, the first current collector 22 is not necessarily required.

The positive electrode layer as the first electrode 23 may be made of any material as long as the material can be used as a positive electrode active material of a lithium rechargeable battery. Preferable examples of the material are those currently used as a positive electrode of a lithium rechargeable battery such as lithium cobaltate ($LiCoO_2$), lithium nickelate ($LiNiO_2$) and lithium manganate ($LiMn_2O_4$), transition metal oxides such as vanadium oxide ($V_2O_5$) and molybdenum oxide ($MoO_3$), and titanium sulfide ($TiS_2$).

The positive electrode may be formed by sputtering, resistance heating vapor deposition, ion beam deposition, electron beam deposition, laser abrasion or chemical vapor deposition.

As the solid electrolyte 24, a solid electrolyte made of lithium phosphorus oxynitride ($Li_xPO_yN_z$) and a transition metal element T is used as described above.

The negative electrode layer as the second electrode 25 may be made of any material as long as the material can be used as a negative electrode active material of a lithium rechargeable battery. Preferable examples of the material are those currently used as a negative electrode of a lithium rechargeable battery, e.g., carbon (C) materials such as graphite and hard carbon, tin (Sn) alloys, lithium cobalt nitride (LiCoN), lithium (Li) metals and lithium alloys such as LiAl. The negative electrode may be formed by sputtering, resistance heating vapor deposition, ion beam deposition, electron beam deposition or laser abrasion.

The second current collector 26 may be made of a material having electron conductivity such as platinum, platinum/palladium, gold, silver, aluminum, copper, ITO or carbon material, just as in the case of the first current collector 22. Other materials than the above may be used as long as they have electron conductivity and do not react with the solid electrolyte 24 or the second electrode 25. The second current collector 26 may be formed by sputtering, resistance heating vapor deposition, ion beam deposition or electron beam deposition.

It is also possible to stack two or more all-solid batteries obtained in the above-described manner.

To explain the all-solid battery including the solid electrolyte of the present invention, the above description is given by way of the structure of a typical all-solid thin-film lithium rechargeable battery. However, the present invention is not limited to the all-solid thin-film lithium rechargeable battery only.

Hereinafter, the present invention is explained by examples, but the present invention is not limited thereto.

EXAMPLES 1–16 AND COMPARATIVE EXAMPLE 1

Thin films of lithium phosphorus oxynitride solid electrolyte ($Li_{2.8}PO_{3.45}N_{0.3}-T_{0.2}$) each containing a transition metal element were prepared as detailed below to make evaluations of an influence of the transition metal element on the solid electrolyte of the present invention. Further, experimental cells including the resulting thin solid electrolyte films as solid electrolyte layers were fabricated.

FIG. 1 shows a schematic section of the experimental cell fabricated in examples of the present invention. As shown in FIG. 1, the experimental cell was formed of a silicon base plate 11, a platinum current collector layer 12, a solid electrolyte layer 13 and a platinum current collector layer 14.

In the first step, a metal mask having an opening of 20 mm×10 mm was placed in a desired position on a surface of the silicon base plate 11, which had been mirror-finished by surface oxidation to have surface roughness of 30 nm or smaller. Then, RF magnetron sputtering was performed to form a platinum film as a platinum current collector layer 12 of 0.5 μm thick.

In the second step, RF magnetron sputtering was performed for 2 hours using a metal mask having an opening of 15 mm×15 mm to form a thin lithium phosphorus oxynitride film on the platinum current collector layer 12. Thus, a solid electrolyte layer 13 of 1.0 μm thick was obtained.

In this step, sputtering targets used were lithium orthophosphate and a transition metal element T shown in Table 1 and sputtering gas used was nitrogen ($N_2$). The RF magnetron sputtering was performed under in-chamber pressure of 2.7 Pa, gas flow rate of 10 sccm and RF power for the lithium orthophosphate target of 200 W. RF power for the lithium orthophosphate and transition metal element T targets was controlled such that the content of the transition metal element to phosphorus atoms would be 20 atom %.

In the third step, using a metal mask having an opening of 10 mm×10 mm placed on the solid electrolyte layer 13 so as not to be misaligned with the solid electrolyte layer 13, RF magnetron sputtering was performed to form a platinum film. Thus, a platinum current collector layer 14 of 0.5 μm thick was obtained.

With respect to the thus fabricated experimental cell, a storage test was performed at 20° C. for 2 weeks. More specifically, the experimental cell was stored in a thermostatic bath of 20° C. placed in a room of 50% relative humidity.

In order to examine variation of the ion conductivity with time, AC impedance of the experimental cell was measured immediately after the fabrication and after storage for 1 day, 2 days, 1 week and 2 weeks. The AC impedance measurement was performed under balanced voltages of 0 and amplitude of ±10 mV, using frequency domain of $10^5$ Hz to 0.1 Hz. Table 1 shows the measurement results, which are expressed regarding the ion conductivity immediately after the fabrication as a reference of 100.

TABLE 1

| | | Ion conductivity | | | | |
|---|---|---|---|---|---|---|
| | Transition metal element | Immediately after the fabrication | 1 day after | 2 day after | 1 week after | 2 week after |
| Ex. 1 | Titanium (Ti) | 100.00 | 85.42 | 79.86 | 72.22 | 71.53 |
| Ex. 2 | Vanadium (V) | 100.00 | 90.14 | 83.10 | 73.94 | 73.24 |
| Ex. 3 | Chromium (Cr) | 100.00 | 87.10 | 80.65 | 76.61 | 75.81 |
| Ex. 4 | Manganese (Mn) | 100.00 | 90.34 | 84.09 | 73.30 | 72.73 |
| Ex. 5 | Iron (Fe) | 100.00 | 91.88 | 84.38 | 72.50 | 71.88 |
| Ex. 6 | Cobalt (Co) | 100.00 | 91.26 | 83.06 | 75.41 | 74.86 |
| Ex. 7 | Nickel (Ni) | 100.00 | 86.29 | 82.29 | 75.43 | 74.86 |
| Ex. 8 | Copper (Cu) | 100.00 | 88.36 | 82.54 | 76.72 | 76.19 |
| Ex. 9 | Niobium (Nb) | 100.00 | 85.71 | 80.00 | 74.29 | 73.57 |
| Ex. 10 | Molybdenum (Mo) | 100.00 | 92.04 | 84.58 | 77.11 | 76.62 |
| Ex. 11 | Ruthenium (Ru) | 100.00 | 88.54 | 82.80 | 75.80 | 75.16 |
| Ex. 12 | Silver (Ag) | 100.00 | 89.12 | 82.38 | 74.09 | 73.58 |
| Ex. 13 | Tantalum (Ta) | 100.00 | 87.05 | 76.26 | 71.94 | 71.22 |
| Ex. 14 | Tungsten (W) | 100.00 | 92.56 | 84.65 | 78.60 | 78.14 |
| Ex. 15 | Platinum (Pt) | 100.00 | 87.25 | 79.41 | 75.00 | 74.51 |
| Ex. 16 | Gold (Au) | 100.00 | 89.70 | 84.24 | 76.97 | 76.36 |
| Com. Ex. 1 | None | 100.00 | 71.43 | 50.0 | 35.71 | 14.29 |

According to the results shown in Table 1, significant change in ion conductivity with storage was not observed in the solid electrolytes of the present invention comprising the lithium phosphorus oxynitride containing the transition metal element. In contrast, the conventional solid electrolyte without containing the transition metal element considerably decreased the ion conductivity with storage.

Thus, it is found advantageous to use the solid electrolyte of the present invention comprising the lithium phosphorus oxynitride containing the transition metal element.

EXAMPLES 17–24

In these examples, experimental cells were fabricated and evaluated in the same manner as Example 1 except that tungsten (W) was used as the transition metal element and the tungsten content to the phosphorus atoms (P) was varied as shown in Table 2.

The impedance measurement was also carried out in the same manner as Example 1 except that it was performed only immediately after the fabrication and after 2 week storage. Further, to check their electron conductivities, voltages of +1.0 V from the balanced voltages were applied to the experimental cells immediately after the fabrication and current flowing after an hour was measured. Table 2 shows the electron conductivity rate, i.e., the rate of the electron conductivity with respect to the ion conductivity.

TABLE 2

| | W content to phosphorus atoms (atom %) | Ion conductivity | | Electron conductivity Rate |
|---|---|---|---|---|
| | | Immediately after the fabrication | 2 week after | |
| Ex. 17 | 0.5 | 100.00 | 31.95 | 6.14E−07 |
| Ex. 18 | 1 | 100.00 | 72.90 | 6.07E−07 |
| Ex. 19 | 5 | 100.00 | 77.31 | 6.20E−07 |
| Ex. 20 | 10 | 100.00 | 77.88 | 6.50E−07 |
| Ex. 21 | 20 | 100.00 | 78.14 | 6.28E−07 |
| Ex. 22 | 50 | 100.00 | 74.65 | 8.08E−07 |
| Ex. 23 | 52 | 100.00 | 71.50 | 2.63E−06 |
| Ex. 24 | 60 | 100.00 | 70.95 | 4.52E−03 |

According to the results shown in Table 2, significant change in ion conductivity with storage was not observed when the transition metal element content was 1 atom % or larger. In contrast, the ion conductivity considerably decreased with storage when the transition metal element content was 0.5 atom %. Where the transition metal element content was 50 atom % or smaller, the electron conductivity was extremely low. However, where the content became larger than 50 atom %, the electron conductivity rate increased.

Thus, the results indicate that in the solid electrolyte of the present invention comprising the lithium phosphorus oxynitride containing the transition metal element, the transition metal element content is preferably 1 to 50 atom % to the phosphorus atoms.

EXAMPLE 25

In this example, an experimental cell was fabricated and evaluated in the same manner as Example 1 except that zirconium (Zr) was used as the transition metal element. Table 3 shows the results.

TABLE 3

| | Transition metal element | Ion conductivity | | | | |
|---|---|---|---|---|---|---|
| | | Immediately after the fabrication | 1 day after | 2 day after | 1 week after | 2 week after |
| Ex. 25 | Zirconium (Zr) | 100.00 | 86.24 | 80.25 | 77.07 | 76.62 |

According to the results shown in Table 3, significant change in ion conductivity with storage was not observed in the solid electrolyte of the present invention comprising lithium phosphorus oxynitride containing zirconium as the transition metal element.

Thus, it is found advantageous to use the solid electrolyte of the present invention comprising lithium phosphorus oxynitride containing zirconium.

EXAMPLE 26 AND COMPARATIVE EXAMPLE 3

In these examples, test batteries were fabricated to make evaluation of an all-solid battery using a solid electrolyte containing lithium phosphorus oxynitride and a transition metal element.

Batteries fabricated in these examples were also configured as shown in FIG. 2. Each of the all-solid batteries includes a silicon base plate 21, a first current collector layer 22, a first electrode 23 as a positive electrode layer, a solid electrolyte layer 24 containing lithium phosphorus oxynitride and a transition metal element, a second electrode 5 as a negative electrode layer and a second current collector layer 26.

In the first step, a metal mask having an opening of 20 mm×12 mm in a desired position was placed on a surface of the silicon base plate 21, which had been mirror-finished by surface oxidation to have surface roughness of 30 nm or smaller. Then, RF magnetron sputtering was performed to form a thin platinum film as a first current collector layer 22 of 0.5 μm thick.

In the second step, RF magnetron sputtering was performed for 2 hours using a metal mask having an opening of 10 mm×10 mm to form a thin lithium cobaltate ($LiCoO_2$) film on the first current collector layer 22. Thus, a positive electrode layer 23 of 1 μm thick was obtained. In this step, sputtering gases used were argon and oxygen at gas flow rates of 7.5 sccm and 2.5 sccm, respectively. In-chamber pressure was 2.7 Pa and RF power for the lithium cobaltate target was 200 W.

In the third step, RF magnetron sputtering was performed for 2 hours using a metal mask having an opening of 15 mm×15 mm to form a thin lithium phosphorus oxynitride film on the positive electrode layer 23. Thus, a solid electrolyte layer 24 of 1 μm thick was obtained.

In this step, sputtering targets used were lithium orthophosphate and tungsten (W). Sputtering gas used was nitrogen ($N_2$). The RF magnetron sputtering was performed under in-chamber pressure of 2.7 Pa, gas flow rate of 10 sccm and RF power for the lithium orthophosphate target of 200 W. RF power for the tungsten target was controlled such that the tungsten content became 20 atom % to the phosphorus atoms. In the fabrication of a test battery of Comparative Example 3, tungsten was not used.

In the fourth step, resistance heating vapor deposition was performed using a metal mask having an opening of 10 mm×10 mm to form a thin lithium metal film on the solid electrolyte layer 24. Thus, a negative electrode layer 25 of 0.5 μm thick was obtained.

Then, in the fifth step, RF magnetron sputtering was performed using a metal mask having an opening of 20 mm×12 mm to form a thin copper film covering the negative electrode layer 25 entirely without contact with the first current collector layer 22. Thus, a second current collector layer 26 of 1.0 μm thick was obtained.

The thus fabricated test batteries were subjected to a 2 week storage test. More specifically, the test batteries were stored in a thermostatic bath of 20° C. placed in a room of 50% humidity.

Further, the test batteries were subjected to AC impedance measurement immediately after the fabrication and after 2 week storage to evaluate improvement in water resistance.

The AC impedance measurement was performed under balanced voltages of 0 and amplitude of ±10 mV using a frequency domain of $10^5$ Hz to 0.1 Hz to determine internal impedances of the test batteries. Table 4 shows the measurement results, in which the internal impedances immediately after the fabrication of the test batteries were expressed as a reference of 100.

TABLE 4

|  | Internal impedance | |
| --- | --- | --- |
|  | Immediately after the fabrication | After 2 week storage |
| Example 26 | 100.00 | 127.96 |
| Comparative Example 3 | 100.00 | 700.28 |

According to the results shown in Table 4, the internal impedance was not significantly changed with storage in the test battery using the solid electrolyte of the present invention comprising the lithium phosphorus oxynitride and transition metal oxide. In contrast, in the test battery comprising a conventional solid electrolyte free from the transition metal element, the solid electrolyte deteriorated with storage, resulting higher internal impedance.

From the above, it is found that an all-solid battery using the solid electrolyte of the present invention containing the lithium phosphorus oxynitride and transition metal element is advantageous in humid atmosphere. Therefore, by using the solid electrolyte of the present invention, an all-solid battery not requiring a protective layer, which is usually used, can be achieved. Further, it is possible to form or mount other electrical devise on the silicon base plate.

EXAMPLES 27–44

In these examples, experimental cells were fabricated and evaluated in the same manner as Example 1 except that the transition metal elements used were molybdenum (Mo), titanium (Ti) and zirconium (Zr), respectively, and their contents to the phosphorus atoms (P) were varied as shown in Tables 5 to 7.

The impedance measurement was also carried out in the same manner as Example 1 except that it was performed only immediately after the fabrication and after 2 week storage. Further, to check their electron conductivities, voltages of +1.0 V from the balanced voltages were applied to the experimental cells immediately after the fabrication and current flowing after an hour was measured. Tables 5 to 7 show the electron conductivity rate, i.e., the rate of the electron conductivity with respect to the ion conductivity.

TABLE 5

|  |  | Ion conductivity | |  |
| --- | --- | --- | --- | --- |
|  | Mo content to phosphorus atoms (atom %) | Immediately after the fabrication | 2 week after | Electron conductivity Rate |
| Ex. 27 | 0.5 | 100.00 | 34.18 | 6.82E−07 |
| Ex. 28 | 1 | 100.00 | 72.14 | 7.46E−07 |
| Ex. 29 | 10 | 100.00 | 74.63 | 7.81E−07 |
| Ex. 30 | 20 | 100.00 | 76.62 | 7.71E−07 |

TABLE 5-continued

|  |  | Ion conductivity | |  |
| --- | --- | --- | --- | --- |
|  | Mo content to phosphorus atoms (atom %) | Immediately after the fabrication | 2 week after | Electron conductivity Rate |
| Ex. 31 | 50 | 100.00 | 73.13 | 9.90E−07 |
| Ex. 32 | 60 | 100.00 | 72.64 | 4.73E−03 |

TABLE 6

|  |  | Ion conductivity | |  |
| --- | --- | --- | --- | --- |
|  | Ti content to phosphorus atoms (atom %) | Immediately after the fabrication | 2 week after | Electron conductivity Rate |
| Ex. 33 | 0.5 | 100.00 | 28.13 | 8.13E−07 |
| Ex. 34 | 1 | 100.00 | 65.97 | 9.38E−07 |
| Ex. 35 | 10 | 100.00 | 69.44 | 9.51E−07 |
| Ex. 36 | 20 | 100.00 | 71.53 | 9.38E−07 |
| Ex. 37 | 50 | 100.00 | 70.49 | 9.65E−07 |
| Ex. 38 | 60 | 100.00 | 67.71 | 6.60E−03 |

TABLE 7

|  |  | Ion conductivity | |  |
| --- | --- | --- | --- | --- |
|  | Zr content to phosphorus atoms (atom %) | Immediately after the fabrication | 2 week after | Electron conductivity Rate |
| Ex. 39 | 0.5 | 100.00 | 32.17 | 7.45E−07 |
| Ex. 40 | 1 | 100.00 | 70.06 | 8.60E−07 |
| Ex. 41 | 10 | 100.00 | 75.16 | 8.73E−07 |
| Ex. 42 | 20 | 100.00 | 76.62 | 8.60E−07 |
| Ex. 43 | 50 | 100.00 | 74.20 | 8.85E−07 |
| Ex. 44 | 60 | 100.00 | 71.34 | 6.05E−03 |

According to the results shown in Tables 5 to 7, significant change in ion conductivity with storage was not observed when the transition metal element content was 1 atom % or larger. However, when the transition metal element content was 0.5 atom %, the ion conductivity considerably decreased with storage. Where the transition metal element content was 50 atom % or smaller, the electron conductivity rate was extremely low. However, if the content became larger than 50 atom %, the electron conductivity rate increased.

The above results indicate that in the solid electrolyte of the present invention comprising lithium phosphorus oxynitride containing the transition metal element, the transition metal element content is preferably 1 to 50 atom % to the phosphorus atoms.

Thus, the use of the solid electrolyte of the present invention allows obtaining an all-solid battery having high energy density, especially an all-solid thin-film lithium rechargeable battery, suitable as a power source of portable devices such as personal computers and cellular phones and microelectronic devices such as IC cards and electronic tags.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. An all-solid battery comprising a solid electrolyte comprising lithium phosphorus oxynitride and a transition metal element selected from the group consisting of Ti, V, Cr, Mn, Fe, Co, Ni, Cu, Zr, Nb, Mo, Ru, Ta, W, Pt and Au.

* * * * *